(12) United States Patent
Du et al.

(10) Patent No.: US 8,507,107 B2
(45) Date of Patent: Aug. 13, 2013

(54) ELECTRONIC DEVICE HOUSING AND METHOD FOR MAKING THE SAME

(75) Inventors: Qi-Jian Du, Shenzhen (CN); Chwan-Hwa Chiang, Taipei Hsien (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 168 days.

(21) Appl. No.: 12/949,955

(22) Filed: Nov. 19, 2010

(65) Prior Publication Data

US 2011/0256361 A1  Oct. 20, 2011

(30) Foreign Application Priority Data

Apr. 14, 2010  (CN) .......................... 2010 1 0146631

(51) Int. Cl.
- B32B 9/00 (2006.01)
- B32B 1/00 (2006.01)
- B32B 15/00 (2006.01)
- B32B 3/00 (2006.01)
- B22D 11/00 (2006.01)
- H02B 1/00 (2006.01)

(52) U.S. Cl.
USPC .......... 428/696; 428/34.4; 428/174; 428/448; 428/544; 428/701; 438/107; 438/336; 361/600

(58) Field of Classification Search
USPC ................. 438/107, 336; 428/448, 696, 544, 428/174; 361/600
See application file for complete search history.

(56) References Cited

U.S. PATENT DOCUMENTS

| | | | |
|---|---|---|---|
| 8,076,011 B2 * | 12/2011 | Chiang et al. ................. | 428/696 |
| 8,257,808 B2 * | 9/2012 | Chiang et al. ................ | 428/34.4 |
| 2004/0202829 A1 * | 10/2004 | Zercher ...................... | 428/195.1 |
| 2008/0246272 A1 * | 10/2008 | Vast et al. ........................ | 283/94 |
| 2009/0141357 A1 * | 6/2009 | Kamura et al. ............... | 359/585 |
| 2011/0223389 A1 * | 9/2011 | Lin et al. ....................... | 428/174 |

* cited by examiner

Primary Examiner — Mark Ruthkosky
Assistant Examiner — Laura C Dettinger
(74) Attorney, Agent, or Firm — Altis Law Group, Inc.

(57) ABSTRACT

An electronic device housing is provided. The electronic device housing includes a substrate, a first metallic coating formed on the substrate, and a second metallic coating formed on a portion of the first metallic coating. The first and second metallic coatings are formed by vacuum sputtering or vacuum vapor deposition. The first and second metallic coatings are all non-conductive. A method for making the electronic device housing is also described there.

16 Claims, 2 Drawing Sheets

ELECTRONIC DEVICE HOUSING AND
METHOD FOR MAKING THE SAME

CROSS-REFERENCE TO RELATED
APPLICATIONS

This application is one of the three related co-pending U.S. patent applications listed below. All listed applications have the same assignee. The disclosure of each of the listed applications is incorporated by reference into all the other listed applications.

| Title | Inventors | Application No. | Filing Date |
|---|---|---|---|
| ELECTRONIC DEVICE HOUSING | QI-JIAN DU et al. | 12/891,904 | Sep. 28, 2010 |
| ELECTRONIC DEVICE HOUSING | QI-JIAN DU et al. | — | — |
| ELECTRONIC DEVICE HOUSING AND METHOD FOR MAKING THE SAME | QI-JIAN DU et al. | — | — |

BACKGROUND

1. Technical Field

The present disclosure relates to electronic device housings, particularly to an electronic device housing having a metallic and changeable color appearance pattern, and a method for making the electronic device housing.

2. Description of Related Art

Decorative metallic coatings are often deposited on housings of electronic devices. The metallic coatings are typically formed by vacuum deposition and are nonconductive so they do not block electromagnetic waves. These metallic coatings may be transparent or translucent. However, the metallic coatings cannot present a changeable color appearance pattern.

Therefore, there is room for improvement within the art.

BRIEF DESCRIPTION OF THE FIGURES

Many aspects of the electronic device housing can be better understood with reference to the following figures. The components in the figures are not necessarily drawn to scale, the emphasis instead being placed upon clearly illustrating the principles of the electronic device housing. Moreover, in the drawings like reference numerals designate corresponding parts throughout the several views.

DETAILED DESCRIPTION

Figure 1:
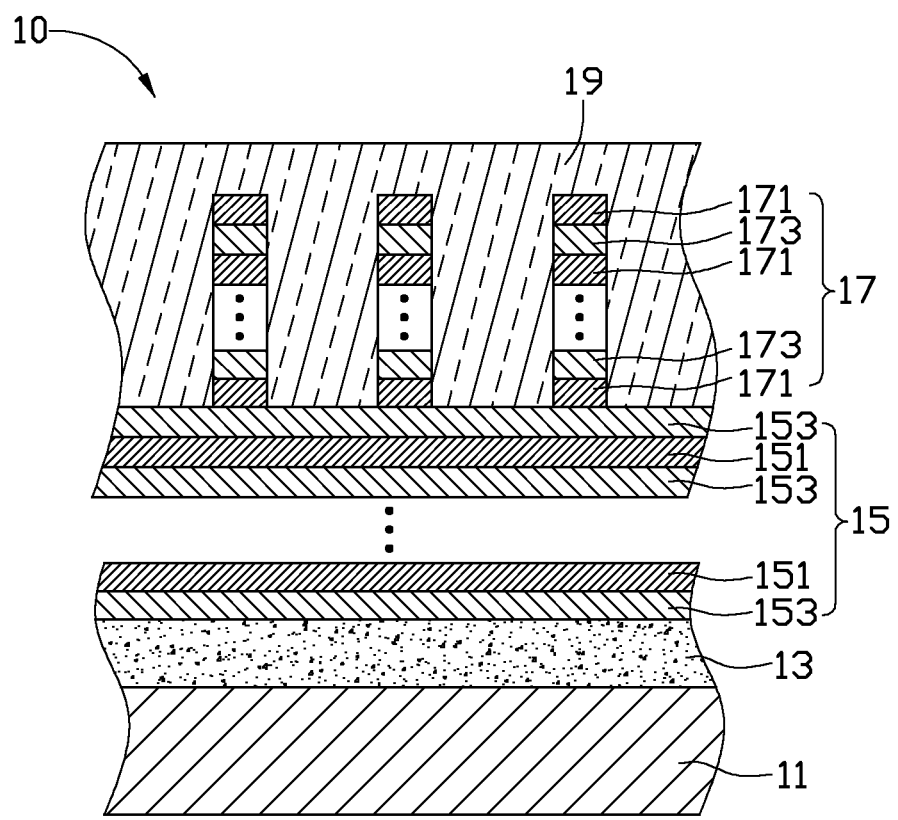
FIG. 1 is a cross-section of an electronic device housing according to an exemplary embodiment.
Figure 2:
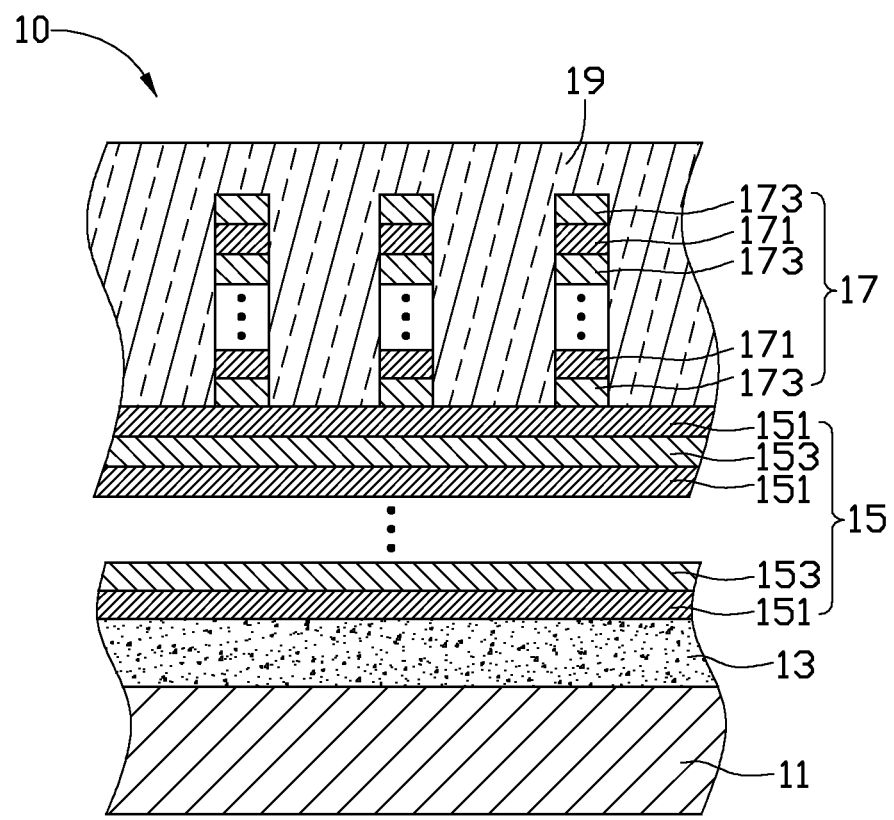
FIG. 2 is another cross-section of an exemplary embodiment of the electronic device housing.

FIG. 1 and FIG. 2 show an electronic device housing 10 according to different exemplary embodiments. The electronic device housing 10 includes a substrate 11, a base paint coating 13 formed on a surface of the substrate 11, a first metallic coating 15 formed on the base paint coating 13, a second metallic coating 17 formed on a portion of the first metallic coating 15, and a top paint coating 19 formed on the second metallic coating 17 and the first metallic coating 15. The electronic device housing 10 may be a housing of a mobile phone, personal digital apparatus (PDA), note book computer, MP3, MP4, GPS navigator, or digital camera.

The substrate 11 may be made of plastic selected from a group consisting of polycarbonate (PC), polyethylene (PE), polymethyl methacrylate (PMMA), and a mixture of polycarbonate and acrylonitrile-butadiene-styrene plastics (PC+ABS). The substrate 11 may instead be made of glass, ceramic, or metal.

The base paint coating 13 may be an acrylic resin paint coating. The base paint coating 13 may have a thickness of about 1 μm to about 30 μm. The base paint coating 13 has a smooth surface for enhancing the bond between the base paint coating 13 and subsequent coatings. The base paint coating 13 may be colored to present a colorful appearance for the electronic device housing 10.

The first metallic coating 15 may be formed on the base paint coating 13 by vacuum sputtering or vacuum vapor deposition. The metallic coating 15 may include a number of first layers 151 interleaved with a number of second layers 153, with a second layer 153 or a first layer 151 outermost on the interleaving pattern. The number of first layers 151 and the number of second layers 153 may include three to seven layers in total. The first layer 151 and the second layer 153 may be respectively niobium pentoxide ($Nb_2O_5$) layer and silicon dioxide ($SiO_2$) layer. Either one niobium pentoxide layer (FIG. 2) or either one silicon dioxide layer (FIG. 1) may be directly formed on the base paint coating 13. The total thickness of the first metallic coating 15 may be of about 50-500 nm. The thickness of the first metallic coating 15 is determined by the thickness needed for presenting a metallic appearance for the electronic device housing 10 without interfering with radio transmission capabilities.

The second metallic coating 17 may be formed on a portion of the surface of the first metallic coating 15 by vacuum sputtering or vacuum vapor deposition. The second metallic coating 17 may include a number of first layers 171 interleaved with a number of second layers 173, with a second layer 173 or a first layer 171 outermost on the interleaving pattern. The number of first layers 171 and the number of second layers 173 may include three to seven layers in total. The first layer 171 and the second layer 173 may be respectively niobium pentoxide ($Nb_2O_5$) layer and silicon dioxide ($SiO_2$) layer. Either one of the niobium pentoxide layer may be directly formed on one of the silicon dioxide layers of the first metallic coating 15 (FIG. 1), or either one of the silicon dioxide layers may be directly formed on one of the niobium pentoxide layers of the first metallic coating 15 (FIG. 2). The total thickness of the second metallic coating 17 may be of about 50-500 nm. The thickness of the second metallic coating 17 is determined by the thickness needed for presenting a metallic appearance without interfering with radio transmission capabilities. The second metallic coating 17 defines decorative patterns or letters.

In the region for forming the second metallic coating 17, the first metallic coating 15 and the second metallic coating 17 reflect light under irradiation of visible light at different incident angles. The light reflected by the first metallic coating 15 has different wavelength than the light reflected by the second metallic coating 17, and these different wavelengths form several intensifying interference regions. The different intensifying interference regions, when viewed during relative movement of the electronic device housing 10, will make the electronic device housing 10 appear to be changing and shifting color patterns or letters in the region of the second metallic coating 17, which will be visually interesting and appealing.

The top paint coating 19 may be a transparent paint coating formed on the second metallic coating 17 and the first metallic coating 15. The paint used for the top paint coating 19 may be an ultraviolet (UV) curable paint. The thickness of the top paint coating 19 may be about 10-50 μm. The top paint coating 19 has a high hardness, which protects the first metallic coating 15 and the second metallic coating 17 from abrasion.

It is to be understood that the base paint coating 13 may be omitted, and the first metallic coating 15 is directly formed on the substrate 11.

It is to be understood that the top paint coating 19 may be omitted in applications where abrasion of the electronic device housing 10 is not a concern.

A method for making the electronic device housing 10 may include the following steps.

The substrate 11 is provided. The substrate 11 may be made of plastic, glass, ceramic, or metal.

The base paint coating 13 is sprayed on the substrate 11.

The first metallic coating 15 is formed on the base paint coating 13 by vacuum sputtering or vacuum vapor deposition.

A mask having a cut out pattern is provided (not shown in the figures). The mask then covers on the first metallic coating 15. The mask may be a soft plastic film, such as polythene film. The mask has a thickness of about less than 1 mm. The pattern of the mask forms decorative patterns or letters.

A vacuum sputtering process or a vacuum vapor depositing process is implemented on the mask and the cut out pattern of the mask forms a metallic coating. The metallic coating formed by the pattern directly bonds with the first metallic coating 15. After that, the mask is removed and accordingly, the metallic coating formed on the mask is also removed and remaining is a pattern that has been formed on the metallic coating ready to receive the second metallic coating 17.

The top paint coating 19 is sprayed on the first metallic coating 15 and the second metallic coating 17.

It should be understood, however, that though numerous characteristics and advantages of the present embodiments have been set forth in the foregoing description, together with details of functions of the embodiments, the disclosure is illustrative only, and changes may be made in detail within the principles of the disclosure to the full extent indicated by the broad general meaning of the terms in which the appended claims are expressed.

What is claimed is:

1. An electronic device housing, comprising:
   a substrate;
   a plurality of first metallic coatings formed on the substrate by vacuum sputtering or vacuum vapor deposition, the first metallic coatings comprising a plurality of niobium pentoxide layers interleaved with a plurality of silicon dioxide layers; and
   a plurality of second metallic coatings formed on a portion surface of the first metallic coatings by vacuum sputtering or vacuum vapor deposition, the second metallic coatings comprising a plurality of niobium pentoxide layers interleaved with a plurality of silicon dioxide layers;
   wherein the regions of the second metallic coatings present changing and shifting color patterns or letters when viewed during a movement of the electronic device housing relative to a viewer.

2. The electronic device housing as claimed in claim 1, wherein a niobium pentoxide layer or a silicon dioxide layer of the first metallic coatings is outermost on the interleaving pattern.

3. The electronic device housing as claimed in claim 1, wherein the first metallic coating has a thickness of about 50-500 nm.

4. The electronic device housing as claimed in claim 3, wherein the first metallic coating presents a metallic appearance without interfering with radio transmission capabilities.

5. The electronic device housing as claimed in claim 2, wherein the number of niobium pentoxide layers and the number of silicon dioxide layers include three to seven layers in total.

6. The electronic device housing as claimed in claim 2, wherein a niobium pentoxide layer or a silicon dioxide layer of the second metallic coatings is outermost on the interleaving pattern.

7. The electronic device housing as claimed in claim 1, wherein the second metallic coating has a thickness of about 50-500 nm.

8. The electronic device housing as claimed in claim 7, wherein the second metallic coating presents a metallic appearance without interfering with radio transmission capabilities.

9. The electronic device housing as claimed in claim 6, wherein the number of niobium pentoxide layers and the number of silicon dioxide layers include three to seven layers in total.

10. The electronic device housing as claimed in claim 6, wherein when the outermost layer of the first metallic coatings is silicon dioxide layer, one of the niobium pentoxide layers of the second metallic coatings is directly formed on the silicon dioxide layer.

11. The electronic device housing as claimed in claim 6, wherein when the outermost layer of the first metallic coatings is niobium pentoxide layer, one of the silicon dioxide layers of the second metallic coatings is directly formed on the niobium pentoxide layer.

12. The electronic device housing as claimed in claim 1, further comprising a base paint coating formed between the substrate and the first metallic coating.

13. The electronic device housing as claimed in claim 12, wherein the base paint coating is an acrylic resin paint coating and has a thickness of about 1-30 μm.

14. The electronic device housing as claimed in claim 1, further comprising a top paint coating formed on the first metallic coating and the second metallic coating.

15. The electronic device housing as claimed in claim 14, wherein the top paint coating is an ultraviolet curable paint coating having a thickness of about 10-50 μm.

16. The electronic device housing as claimed in claim 1, wherein the substrate is made of plastic, glass, ceramic or metal.

* * * * *